United States Patent
Yang

(10) Patent No.: US 10,741,397 B2
(45) Date of Patent: Aug. 11, 2020

(54) LINER PLANARIZATION-FREE PROCESS FLOW FOR FABRICATING METALLIC INTERCONNECT STRUCTURES

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/423,404

(22) Filed: May 28, 2019

(65) Prior Publication Data

US 2019/0279873 A1    Sep. 12, 2019

Related U.S. Application Data

(62) Division of application No. 15/295,250, filed on Oct. 17, 2016, now Pat. No. 10,431,464.

(51) Int. Cl.
    *H01L 21/265* (2006.01)
    *H01L 21/768* (2006.01)
    *H01L 23/532* (2006.01)

(52) U.S. Cl.
    CPC .... *H01L 21/26566* (2013.01); *H01L 21/7684* (2013.01); *H01L 21/76856* (2013.01); *H01L 21/76865* (2013.01); *H01L 21/76883* (2013.01); *H01L 23/53209* (2013.01); *H01L 23/53238* (2013.01); *H01L 23/53252* (2013.01); *H01L 23/53266* (2013.01)

(58) Field of Classification Search
    None
    See application file for complete search history.

(56) References Cited

U.S. PATENT DOCUMENTS 5,011,580 A   4/1991   Pan et al.
5,236,551 A   8/1993   Pan
(Continued)

FOREIGN PATENT DOCUMENTS

CN   103972156 A   8/2014
EP   1401015 A1   3/2004
WO   02068717 A1   9/2002

OTHER PUBLICATIONS

List of IBM Patents or Patent Applications Treated as Relate.

*Primary Examiner* — Moazzam Hossain
*Assistant Examiner* — Stanetta D Isaac
(74) *Attorney, Agent, or Firm* — L. Jeffrey Kelly; Ryan, Mason & Lewis, LLP

(57) ABSTRACT

A method includes forming a dielectric layer on a substrate and patterning the dielectric layer to form an opening in the dielectric layer. A first layer of metallic material (e.g., non-nitride metal) is deposited to form a liner layer on an upper surface of the dielectric layer and on exposed surfaces within the opening. A second layer of metallic material (e.g., copper) is deposited to fill the opening with metallic material. An overburden portion of the second layer of metallic material is removed by planarizing the second layer of metallic material down an overburden portion of the liner layer on the upper surface of the dielectric layer. A surface treatment process (e.g., plasma nitridation) is performed to convert the overburden portion of the liner layer into a layer of metal nitride material. The layer of metal nitride material is selectively etched away using a wet etch process.

20 Claims, 5 Drawing Sheets

(56) References Cited

U.S. PATENT DOCUMENTS

| | | |
|---|---|---|
| 5,238,500 A | 8/1993 | Bergman |
| 5,656,554 A | 8/1997 | Desai et al. |
| 6,001,730 A | 12/1999 | Farkas et al. |
| 6,150,260 A | 11/2000 | Roy |
| 6,157,081 A | 12/2000 | Nariman et al. |
| 6,191,040 B1 | 2/2001 | Glass |
| 6,276,997 B1 | 8/2001 | Li |
| 6,299,516 B1 | 10/2001 | Tolles |
| 6,340,601 B1 | 1/2002 | Curran, Jr. et al. |
| 6,376,335 B1 | 4/2002 | Zhang et al. |
| 6,435,944 B1 | 8/2002 | Wang et al. |
| 6,443,814 B1 | 9/2002 | Miller et al. |
| 6,458,016 B2 | 10/2002 | Merchant et al. |
| 6,638,326 B2 | 10/2003 | Small et al. |
| 6,852,136 B2 | 2/2005 | Park et al. |
| 6,858,540 B2 | 2/2005 | Sun et al. |
| 6,870,263 B1 | 3/2005 | Clevenger et al. |
| 6,939,795 B2 | 9/2005 | Eissa et al. |
| 6,982,227 B2 | 1/2006 | Cooney, III et al. |
| 7,008,803 B2 | 3/2006 | Kane et al. |
| 7,052,997 B2 | 5/2006 | Sandhu |
| 7,323,416 B2 | 1/2008 | Liu et al. |
| 7,666,781 B2 | 2/2010 | Hsu et al. |
| 7,745,324 B1 | 6/2010 | Yang et al. |
| 7,922,824 B2 | 4/2011 | Minsek et al. |
| 8,835,326 B2 | 9/2014 | Fitzsirnrnons et al. |
| 8,987,859 B2 | 3/2015 | Plekhanov et al. |
| 9,012,322 B2 | 4/2015 | Duong et al. |
| 9,040,422 B2 | 5/2015 | Wang et al. |
| 9,190,285 B1 | 11/2015 | Abdallah et al. |
| 9,269,612 B2 | 2/2016 | Chen et al. |
| 9,275,874 B2 | 3/2016 | Tanwar et al. |
| 9,685,406 B1 | 6/2017 | Briggs et al. |
| 2002/0119245 A1 | 8/2002 | Verhaverbeke |
| 2002/0180052 A1 | 12/2002 | Layadi et al. |
| 2004/0051075 A1 | 3/2004 | Aoki et al. |
| 2004/0077171 A1 | 4/2004 | Chuang et al. |
| 2005/0085070 A1 | 4/2005 | Park |
| 2006/0043590 A1 | 3/2006 | Chen et al. |
| 2006/0189134 A1 | 8/2006 | Cotte et al. |
| 2006/0226122 A1 | 10/2006 | Wojtczak et al. |
| 2007/0072417 A1* | 3/2007 | Nakamura ........ H01L 21/76838 438/660 |
| 2007/0117342 A1 | 5/2007 | Chen et al. |
| 2008/0066860 A1 | 3/2008 | Cotte et al. |
| 2008/0102599 A1 | 5/2008 | Yang |
| 2009/0101864 A1 | 4/2009 | Song et al. |
| 2009/0200669 A1 | 8/2009 | Yang et al. |
| 2010/0029078 A1 | 2/2010 | Russell et al. |
| 2013/0071975 A1 | 3/2013 | Kitano et al. |
| 2013/0299994 A1 | 11/2013 | Park et al. |
| 2014/0035141 A1 | 2/2014 | Cheng et al. |
| 2014/0199832 A1 | 7/2014 | Nguyen et al. |
| 2015/0093891 A1 | 4/2015 | Zope et al. |
| 2015/0130065 A1 | 5/2015 | Duong et al. |
| 2015/0137259 A1 | 5/2015 | Han et al. |
| 2016/0020087 A1 | 1/2016 | Liu et al. |
| 2016/0020142 A1 | 1/2016 | Chen et al. |
| 2016/0049364 A1 | 2/2016 | Edelstein et al. |
| 2016/0300949 A1 | 10/2016 | Lee et al. |
| 2018/0366324 A1 | 12/2018 | Cao et al. |

* cited by examiner

100

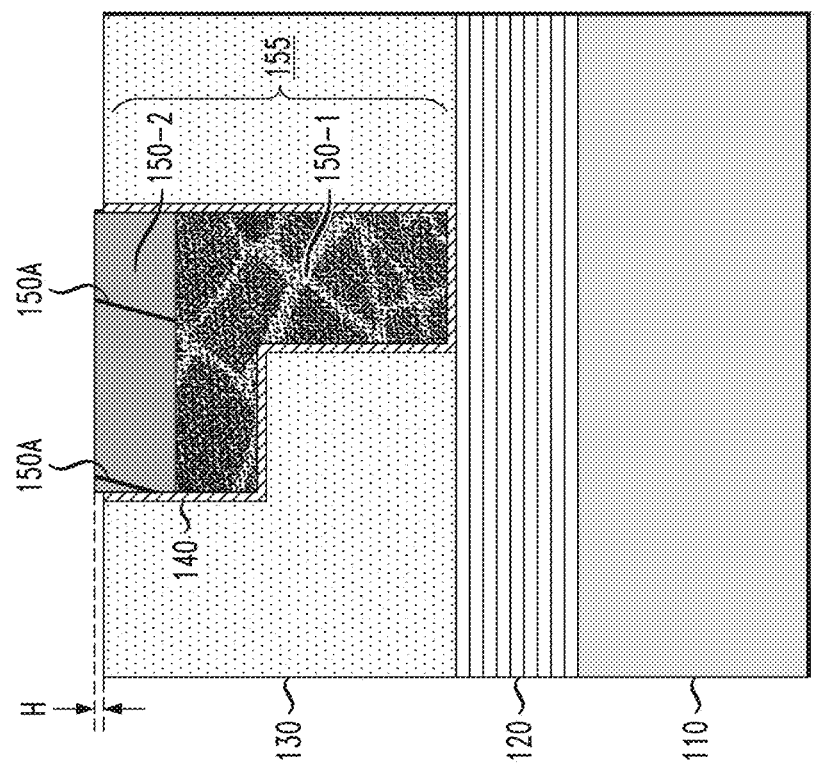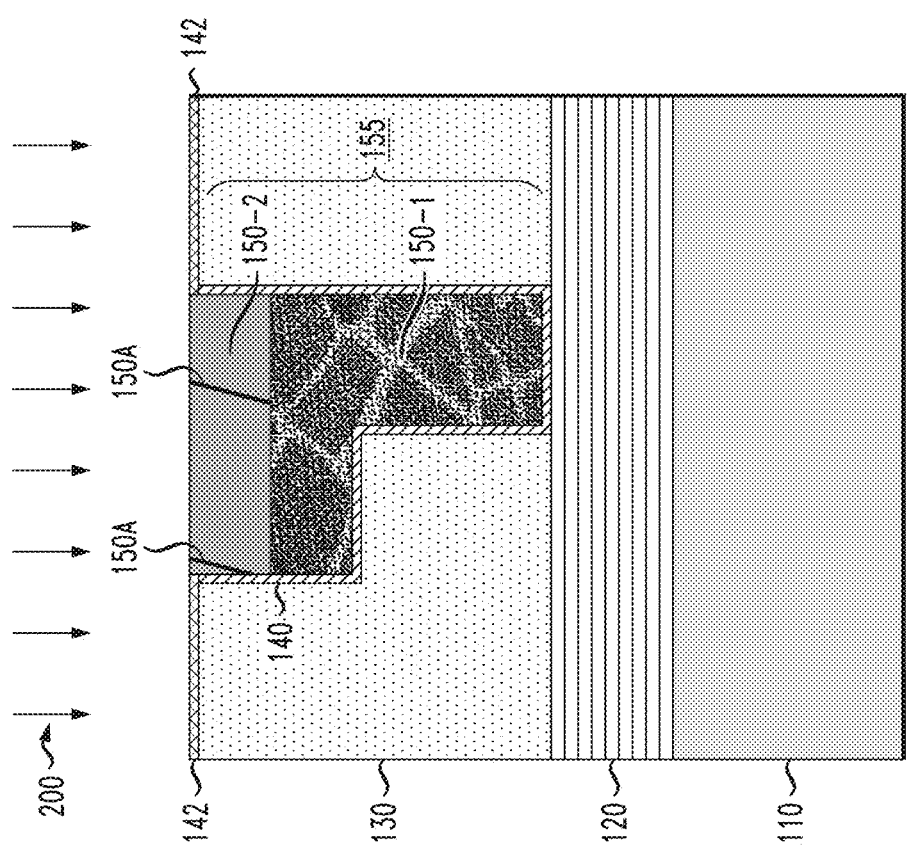

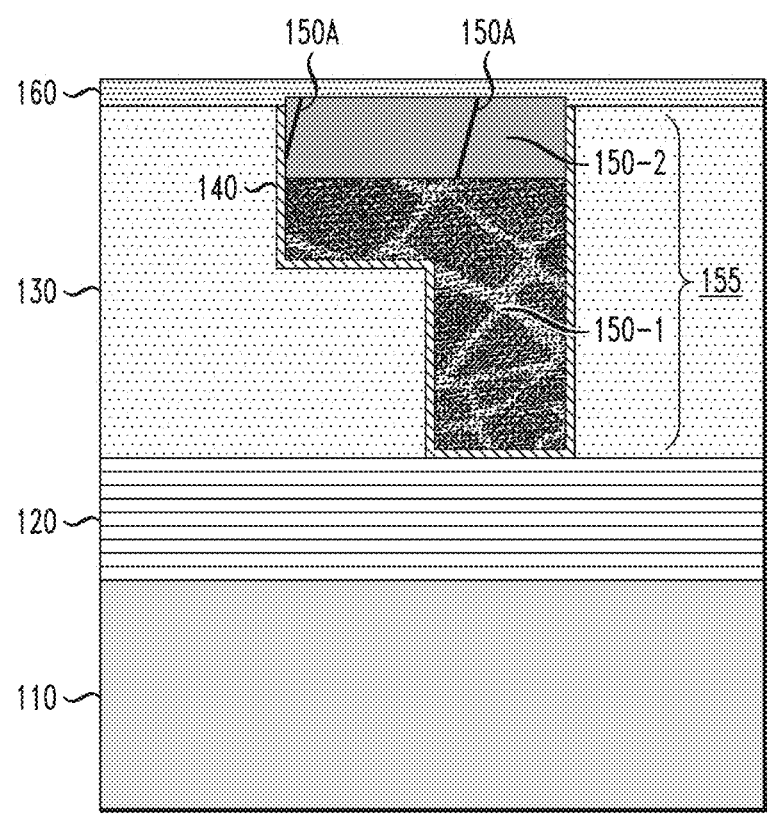

US 10,741,397 B2

LINER PLANARIZATION-FREE PROCESS FLOW FOR FABRICATING METALLIC INTERCONNECT STRUCTURES

TECHNICAL FIELD

This disclosure generally relates to semiconductor fabrication techniques and, in particular, techniques for fabricating metallic interconnect structures.

BACKGROUND

A semiconductor integrated circuit chip is typically fabricated with a back-end-of-line (BEOL) interconnect structure, which comprises multiple levels of metal lines and inter-level metal vias. The BEOL interconnect structure serves to connect various integrated circuit components and devices that are fabricated as part of a front-end-of-line (FEOL) layer of the semiconductor integrated circuit chip. Current state of the art BEOL process technologies typically implement copper to form BEOL interconnect structures, as the low resistivity of copper material significantly reduces resistance in the BEOL interconnect structure, resulting in improved conduction and higher performance. Conventional process flows for fabricating copper interconnect structures utilize a chemical-mechanical planarizing (CMP) process to remove overburden copper material and overburden liner material from an upper surface of an interlayer dielectric (ILD) layer in which copper interconnect structures are formed, as well as planarize the upper surface of the ILD layer. The use of CMP to remove overburden liner material can result in poor quality copper interconnects for various reasons.

For example, due to a non-uniform surface topography, a certain amount of over polish of the ILD layer is required to ensure that all of the overburden metallic liner material is removed from the surface of the ILD layer so that electrical shorts are avoided in the BEOL interconnect network. The over polishing of the ILD layer also results in removing of an upper portion of the copper metallization formed in the ILD layer, which typically comprises high quality copper material (large metallic grains), while leaving lower quality copper material (smaller metallic grains) in the lower portion of the copper metallization. As such, the resulting copper metallization has increased resistance. Furthermore, the over polishing of the surface of the ILD layer results in copper "dishing" of the upper surface of the copper metallization due to the fact that copper polishing rate is typically higher than the polishing rate of the metallic liner material and the dielectric material of the ILD layer. As such, the use of CMP in BEOL process flows can lead to increased electrical resistivity and degraded interconnect reliability.

SUMMARY

Embodiments of the invention include methods for fabricating metal interconnect structures. For example, in one embodiment, a method for fabricating a device comprises: forming a dielectric layer on a substrate; patterning the dielectric layer to form an opening in the dielectric layer; depositing a first layer of metallic material over the dielectric layer to form a liner layer on an upper surface of the dielectric layer and on exposed surfaces within the opening; depositing a second layer of metallic material to fill the opening with metallic material; removing an overburden portion of the second layer of metallic material by planarizing the second layer of metallic material down an overburden portion of the liner layer on the upper surface of the dielectric layer; applying a surface treatment to convert the overburden portion of the liner layer into a layer of metal nitride material; and selectively etching away the layer of metal nitride material.

In another embodiment, a method for fabricating a device comprises: forming an interlayer dielectric (ILD) layer on a substrate; patterning the ILD layer to form a dual damascene opening comprising a via and a trench; depositing a first layer of metallic material over the ILD layer to form a liner layer on an upper surface of the ILD layer and on exposed surfaces within the dual damascene opening; depositing a layer of copper material to fill the dual damascene opening with copper material; performing a heat treatment to convert a first microstructure of at least an upper portion of the copper material in the trench to a second microstructure comprising an average grain size which is greater than an average grain size of the first microstructure; performing a chemical-mechanical planarizing process to remove an overburden portion of the layer of copper material down an overburden portion of the liner layer on the upper surface of the ILD layer; applying a surface treatment to convert the overburden portion of the liner layer into a layer of metal nitride material; and selectively etching away the layer of metal nitride material.

Another embodiment includes a semiconductor device. The semiconductor device comprises a metal interconnect structure formed within a dielectric layer, wherein the metal interconnect structure comprises a metal line, and a non-nitride metallic liner disposed between the metal line and the dielectric layer. An upper surface of the non-nitride metallic liner is coplanar with a surface of the dielectric layer, and an upper surface of the metal line extends above the surface of the dielectric layer by an amount of about 0.5 nm to about 10 nm. An upper portion of the metal line comprises grains that have an average grain size which is greater than a critical dimension of the metal line. In another embodiment, the grains in the upper portion of the metal line have an average grain size which is greater than an average grain size of grains in a lower portion of the metal line. In one embodiment, metal line is formed of copper and the non-nitride metallic liner is formed of titanium.

Other embodiments will be described in the following detailed description of embodiments, which is to be read in conjunction with the accompanying figures.

BRIEF DESCRIPTION OF THE DRAWINGS

FIGS. 1 through 9 schematically illustrate a method for fabricating a metallic interconnect structure of a semiconductor device, according to an embodiment of the invention, wherein:

FIG. 1 is a cross-sectional schematic side view of the semiconductor device at an intermediate stage of fabrication after depositing an interlevel dielectric (ILD) layer on a substrate;

FIG. 2 is a cross-sectional schematic side view of the semiconductor device of FIG. 1 after patterning the ILD layer to form an opening in the ILD layer;

FIG. 3 is a cross-sectional schematic side view of the semiconductor device of FIG. 2 after depositing a metallic liner layer over the surface of the semiconductor device to line the sidewall and bottom surfaces of the opening in the ILD layer with metallic liner material;

FIG. 4 is a cross-sectional schematic side view of the semiconductor device of FIG. 3 after depositing a layer of metallic material to fill the opening in the ILD layer with metallic material, wherein the layer of metallic material as deposited comprises a polycrystalline microstructure;

FIG. 5 is a cross-sectional schematic side view of the semiconductor device of FIG. 4 after applying a heat treatment to convert the polycrystalline microstructure of at least a portion of the layer of metallic material to a second microstructure comprising an average grain size which is greater than an average grain size of the polycrystalline microstructure;

FIG. 6 is a cross-sectional schematic side view of the semiconductor device of FIG. 5 after planarizing the surface of the semiconductor device down to an overburden portion of the metallic liner layer on the surface of the ILD layer;

FIG. 7 is a cross-sectional schematic side view of the semiconductor device of FIG. 6, which shows a controlled surface treatment being applied to the overburden portion of the metallic liner layer to convert the metallic material of the overburden portion of the metallic liner layer into a metal nitride material;

FIG. 8 is a cross-sectional schematic side view of the semiconductor device of FIG. 7 after selectively removing the metal nitride material from the surface of the ILD layer; and FIG. 9 is a cross-sectional schematic side view of the semiconductor device of FIG. 8 after forming a capping layer on the surface of the ILD layer.

DETAILED DESCRIPTION

Embodiments will now be described in further detail with regard to methods for fabricating low resistance metal interconnect structures using liner planarization-free process flows, as well as semiconductor devices comprising BEOL interconnect structures that are formed using liner planarization-free process flows. For example, as explained in further detail below, embodiments of the invention utilize wet chemical etching (instead of CMP) to selectively remove overburden metallic liner material from the field regions of an ILD layer. The use of wet chemical etching to selectively remove the overburden metallic liner material eliminates the need for over polishing and dishing of the metallization structures (e.g., copper metallization) and allows large metallic grains to be maintained in upper regions of the metallization structures. As such, liner planarization-free process flows according to embodiments of the invention enable the formation of BEOL interconnect structures (e.g., copper interconnect structures) with lower resistivity and enhanced reliability.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
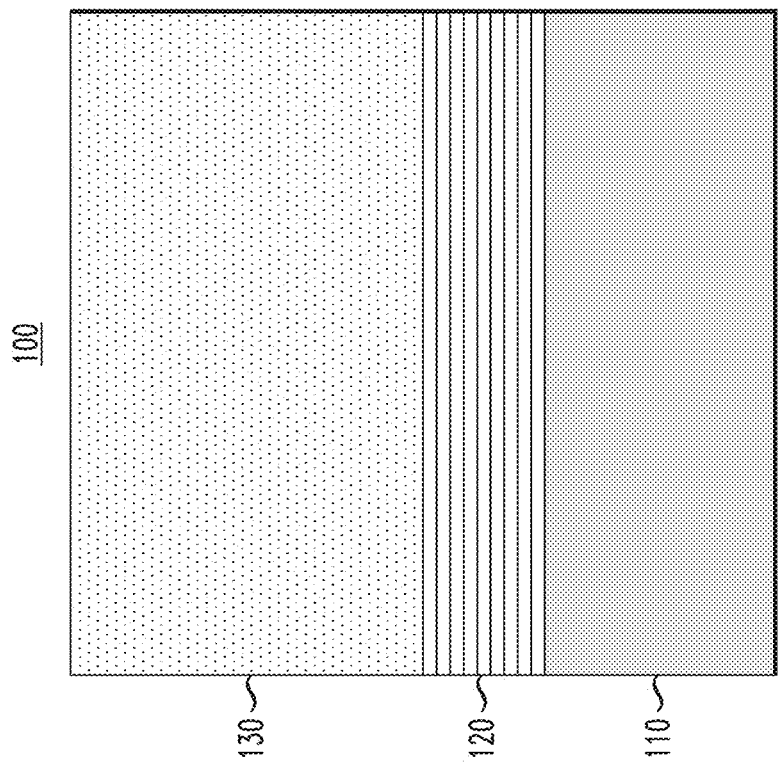

FIGS. 1 through 9 schematically illustrate a method for fabricating a metallic interconnect structure of a semiconductor device, according to an embodiment of the invention. To begin, FIG. 1 is a cross-sectional schematic side view of a semiconductor device 100 at an intermediate stage of fabrication after depositing an ILD layer 130 on a substrate 110/120. The substrate 110/120 comprises a base semiconductor substrate 110 and a FEOL (front end of the line) and MOL (middle of the line) structure 120 formed on front side surface of the semiconductor substrate 110. The based semiconductor substrate 110 is illustrated as a generic substrate layer, and may comprise different types of substrate structures.

For example, in one embodiment, the semiconductor substrate 110 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 110 may comprise a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of a FEOL layer.

The FEOL/MOL structure 120 comprises a FEOL layer formed on the semiconductor substrate 110. The FEOL layer comprises various semiconductor devices and components that are formed in or on the active surface of the semiconductor substrate 110 to provide integrated circuitry for a target application. For example, the FEOL layer comprises FET devices (such as FinFET devices, planar MOSFET device, etc.), bipolar transistors, diodes, capacitors, inductors, resistors, isolation devices, etc., which are formed in or on the active surface of the semiconductor substrate 110. In general, FEOL processes typically include preparing the semiconductor substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conductive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure 120.

A BEOL interconnect structure is formed on the FEOL/MOL structure 120 using techniques discussed herein to connect the various integrated circuit components of the FEOL layer. As is known in the art, a BEOL structure comprises multiple levels of dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In the example embodiment of FIG. 1, the ILD layer 130 is formed as part of a first interconnect layer of a BEOL interconnect structure. The ILD layer 130 may comprise any suitable dielectric material that is commonly utilized in BEOL process technologies. For example, the ILD layer 130 can be formed of a dielectric material including, but not limited to, silicon oxide (e.g. $SiO_2$), silicon nitride (e.g., ($Si_3N_4$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The ILD layer 130 may be deposited using known deposition techniques, such as, for example, ALD (atomic layer deposition), CVD (chemical vapor deposition) PECVD (plasma-enhanced CVD), or PVD (physical vapor deposition), or spin-on deposition. The thickness of the ILD layer 130 will vary depending on the application, and may have a thickness in a range of about 30 nm to about 200 nm, for example.

Figure 2:
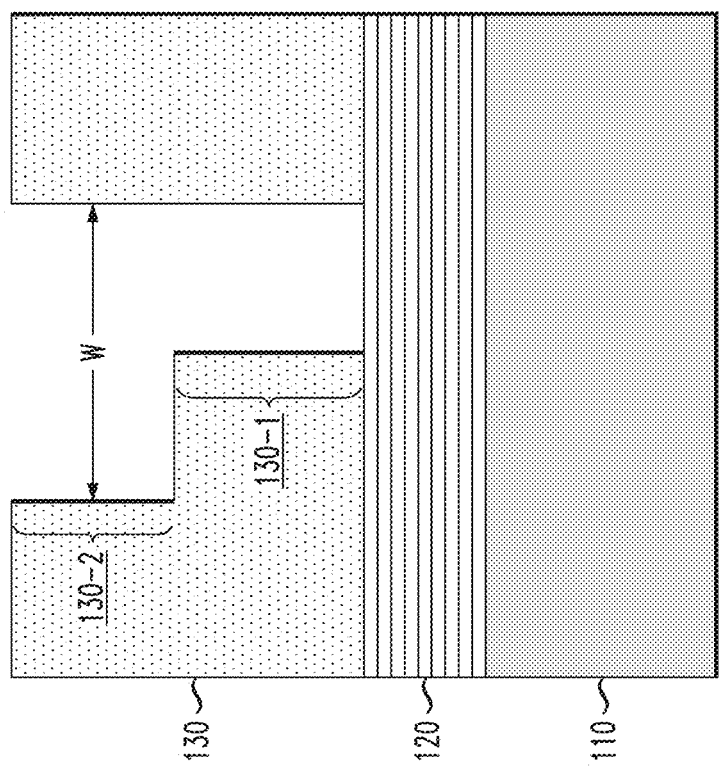

FIG. 2 is a cross-sectional schematic side view of the semiconductor device of FIG. 1 after patterning the ILD layer 130 to form an opening 130-1/130-2 in the ILD layer 130. In the example embodiment of FIG. 2, the opening 130-1/130-2 comprises a via opening 130-1 and a trench opening 130-2. The trench opening 130-2 is formed with a width W, which defines a "critical dimension" (CD) of metal wiring which is subsequently formed by filling the trench opening 130-2 with metallic material (the width W is fixed by the CD of the particular fabrication process that is implemented). The ILD layer 130 can be photolithographically patterned using known damascene techniques to form the opening 130-1/130-2. The example embodiment of FIG. 2 illustrates one method for patterning the via opening 130-1 and the trench opening 130-2 in a single layer of dielectric material (i.e., the ILD layer 130) using one of various "dual" damascene patterning techniques known in the art. In particular, such dual damascene techniques generally include a "via first" process, a "trench first" process, and a "buried via" process, which comprises different sequences for etching the first ILD layer 130 to pattern the via opening 130-1 and trench opening 130-2, but where each type of dual damascene process results in the semiconductor structure shown in FIG. 2. In other embodiments single damascene techniques can be utilized to form the structure shown in FIG. 2. In particular, with a single damascene process, metal vias and metal lines are separately formed in different ILD layers. The damascene patterning can be implemented using any conventional photolithography and etching process, e.g., forming a photoresist mask and etching the dielectric material of the ILD layer using a dry etch process such as RIE (reactive ion etching), etc.

Figure 3:
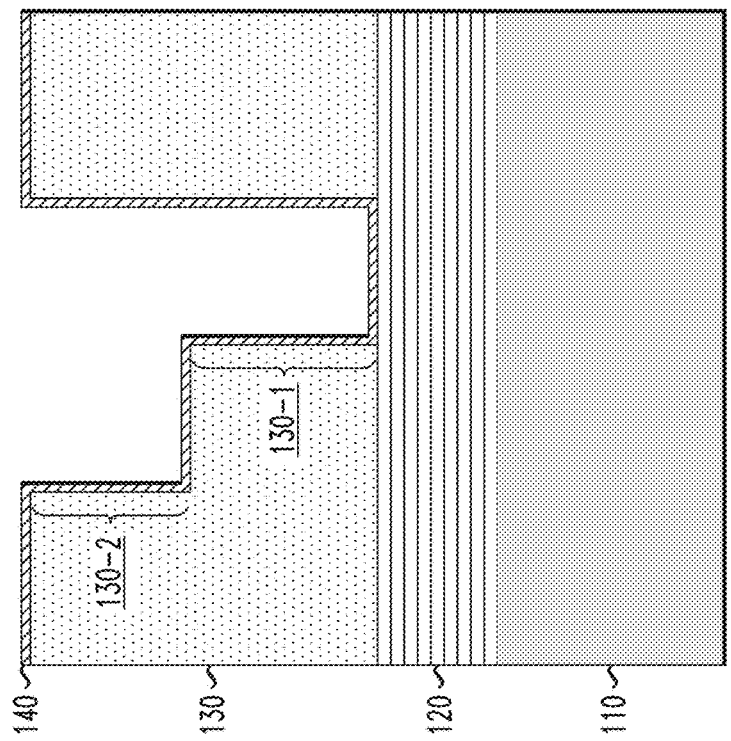

Next, FIG. 3 is a cross-sectional schematic side view of the semiconductor device of FIG. 2 after depositing a layer of liner material 140 to line the sidewall and bottom surfaces of the opening 130-1/130-2 in the ILD layer 130 with metallic liner material. The liner layer 140 serves as a barrier diffusion layer and as an adhesion layer (or seed layer) with regard to the metallic material (e.g., copper material) which is subsequently deposited to fill the opening 130-1/130-2 in the ILD layer 130 and form a metallic interconnect structure (e.g., metal line and via). In one embodiment, the liner layer 140 is formed of titanium (Ti). In other embodiments, the liner layer 140 may be formed of a single metallic material such as, e.g., tantalum (Ta), aluminum (Al), cobalt (Co), ruthenium (Ru), tungsten (W), iridium (Ir), rhodium (Rh), manganese (Mn), or nickel (Ni), or multiple layers and/or combinations of such metallic materials. In one embodiment, the liner layer 140 comprises a conformal layer of metallic material having thickness in a range of about 1 nm to about 100 nm.

Figure 4:
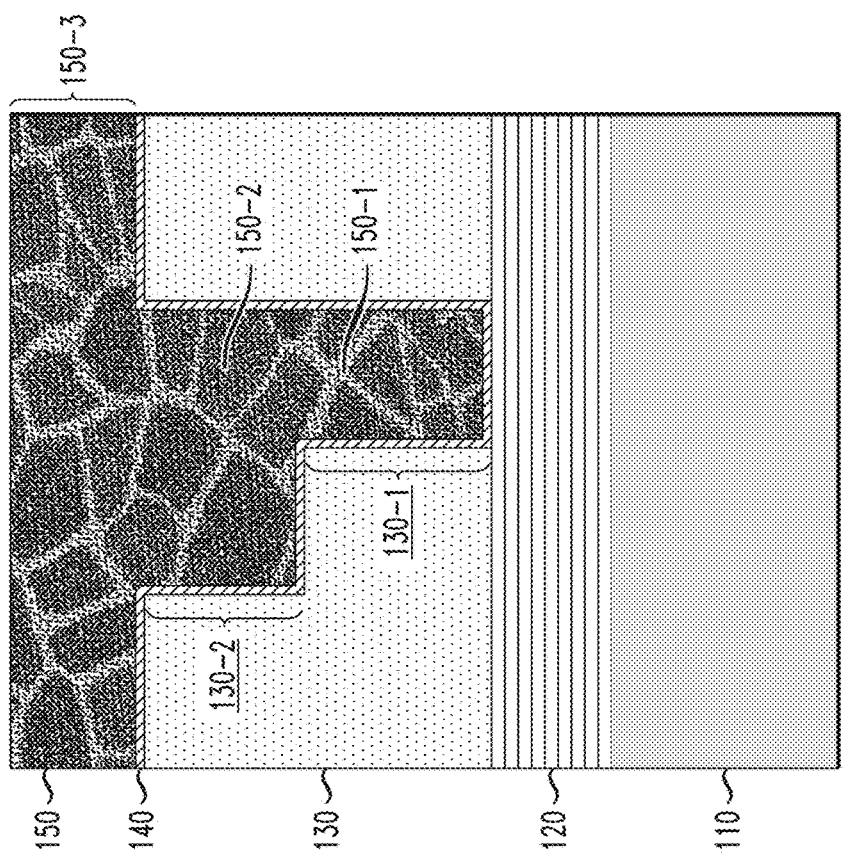

FIG. 4 is a cross-sectional schematic side view of the semiconductor device of FIG. 3 after depositing a layer of metallic material 150 to fill the opening 130-1/130-2 in the ILD layer 130 with metallic material. As depicted in FIG. 4, the metallic material within the via opening 130-1 comprises a metal via 150-1, the metallic material within the trench opening 150-2 comprises a metal wire 150-2, and the metallic material disposed over the surface of the ILD layer 130 comprises overburden metallic material 150-3 which is subsequently removed. In one embodiment of the invention, the layer of metallic material 150 comprises copper (Cu). In other embodiments, the metallic material 150 can be, for example, Al, W, Co, Ru, Ir, Rh, Ni, or alloys thereof. The layer of metallic material 150 is deposited using known techniques such as electroplating, electroless plating, CVD, PVD, or a combination of methods.

In an exemplary embodiment where the metallic material 150 comprises electroplated copper, the copper metallic material 150 as deposited comprises a polycrystalline microstructure, as schematically illustrated in FIG. 4. A polycrystalline microstructure comprises many crystallites (or grains) of varying size and orientation, and with random texture and no grain direction. A polycrystalline microstructure comprises many grain boundaries, which tends to decrease the electrical conductivity of the metallic material, and tends to enhance electromigration due to grain boundary diffusion of electrons, which is not desirable. Accordingly, to further reduce the electrical resistance of the metal wiring, the metallic material 150 is subjected to a heat treatment to convert the polycrystalline microstructure of the metallic material 150 into a different microstructure comprising larger grains with a given grain direction. For example, in one embodiment, the polycrystalline microstructure is converted into a "bamboo" or "columnar" microstructure, having large elongated grains that extend in a particular direction.

Figure 5:
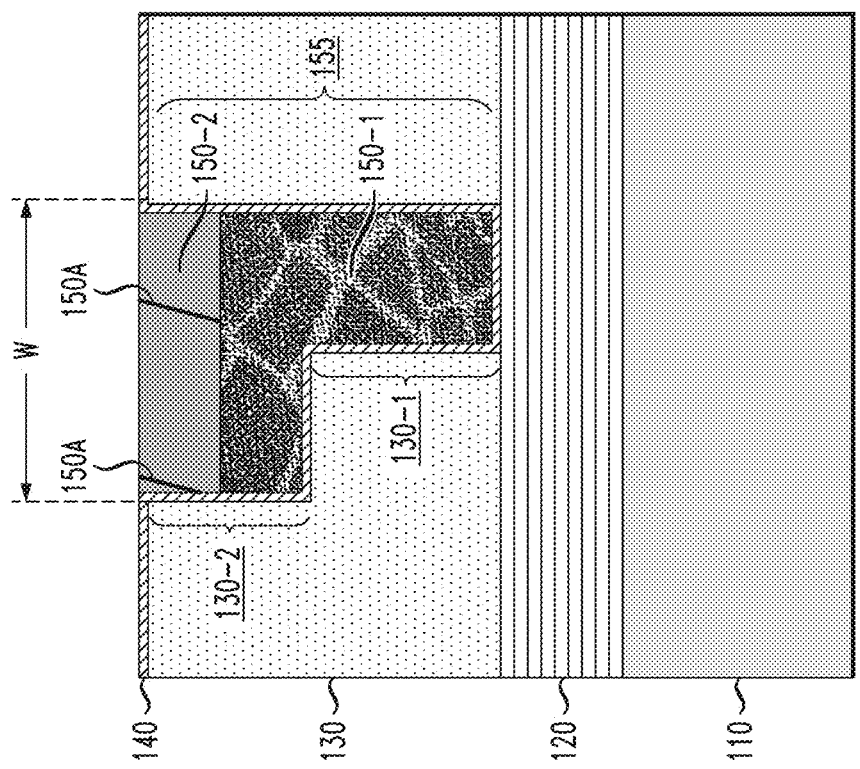

For example, FIG. 5 is a cross-sectional schematic side view of the semiconductor device of FIG. 5 after applying a heat treatment to the metallic material 150 to convert at least a portion of the metallic material 150 from a polycrystalline microstructure to second microstructure comprising larger grains that are defined by grain boundaries 150A. In one embodiment, the second microstructure comprises a bamboo microstructure. In particular, in one example embodiment of the invention as shown in FIG. 5, the heat treatment is applied to convert the microstructure of the overburden metallic material 150-3 and at least an upper portion of the metallic material 150-2 disposed within the trench opening 130-2 from a polycrystalline microstructure (as shown in FIG. 4) to a larger grain or bamboo microstructure as schematically shown in FIG. 5, while the microstructure of the metallic material 150-2 within the bottom portion of the trench opening 130-2 and the metallic material 150-1 within the via opening 130-1 remains polycrystalline.

As specifically shown in FIG. 5, the overburden metallic material 150-3 and the portion of the metallic material 150-2 (which forms a metal line) within the upper region of the trench opening 130-2 comprises large grains that are separated by grain boundaries 150A which extend in substantially the same direction (e.g., in a substantially vertical direction), providing a columnar or bamboo microstructure. This microstructure serves to minimize electromigration as the grain boundaries 150A extend in a substantially vertical direction which is essentially perpendicular to the current flow along the "length" direction of the metal line 150-2 (perpendicular to the width W).

Figure 6:
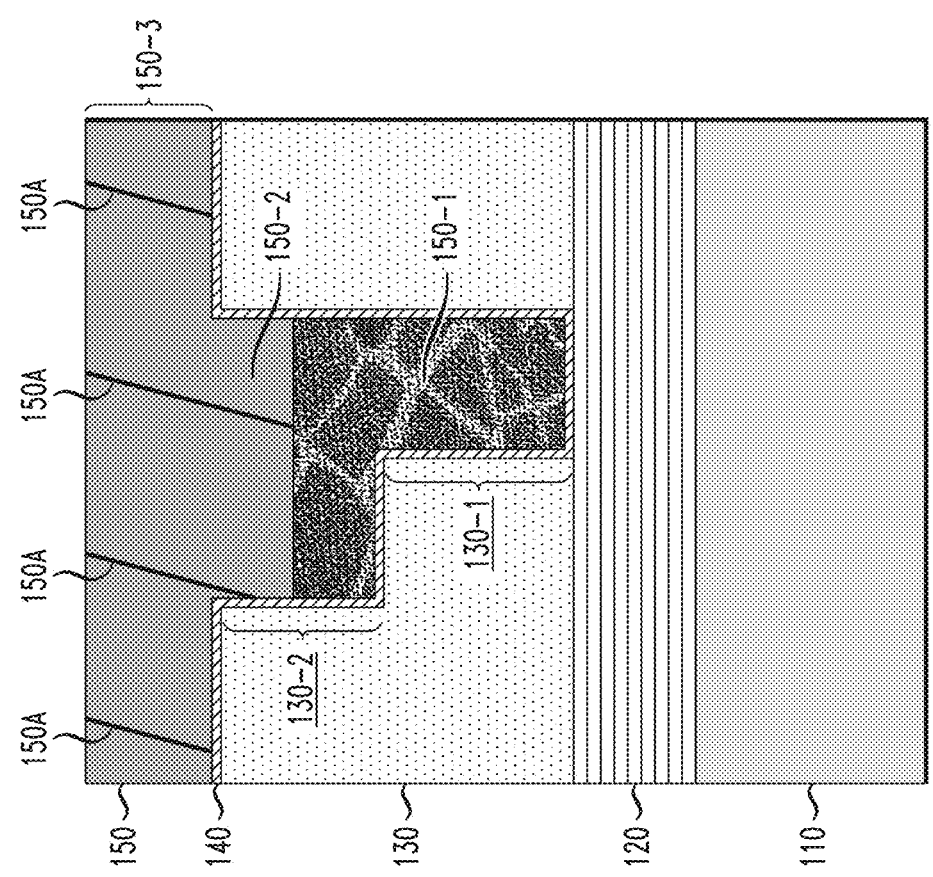

In one embodiment, as shown in FIG. 5, an average grain size of the microstructure of the metallic material in an upper region of the trench 130-2 (i.e., the upper region of the metal line 150-2, FIG. 5) is greater than an average size of the polycrystalline microstructure in the lower region of the trench 130-2 (i.e., the lower region of the metal line 150-2, FIG. 6). It is to be understood that the term "average grain size" as used herein is a well-known term of art, which denotes a parameter that can be estimated using known techniques. For example, one technique for estimating the average grain size of a given material is known as the "intercept" method. With this method, a straight line of a given length (L) is drawn through a micrograph of the crystal structure of the given material (e.g., a TEM (Transmission Electron Microscope) or STEM (Scanning Transmission Electron Microscope) microstructure image). The number of grains (N) that the straight line intersects is counted. The average grain size is then determined as (L)/(N).

In another embodiment of the invention, the average grain size of the metallic material in the upper region of the trench 130-2 (i.e., the upper region of the metal line 150-2, FIG. 5) in the "length" direction of the trench 130-2 (perpendicular to width W) is greater than a critical dimension (e.g., width W1) of the metal line 150-2.

The heat treatment that is used to convert the polycrystalline microstructure of the metallic material 150 to a second microstructure comprising larger grains (e.g., columnar or bamboo microstructure) can be implemented using various techniques. For example, in one embodiment of the invention, the semiconductor structure of FIG. 5 can be placed in a furnace and subjected to a thermal anneal process in a temperature range of about 100 degrees Celsius to about 500 degrees Celsius for a period of about 20 minutes to about three hours. In another embodiment, a laser process can be implemented using known methods in which a laser beam (e.g., pulsed beam) is directed at the surface of the metallic material 150 to heat the metallic material 150 to a temperature which effectively causes a thermal anneal of the metallic material 150 and thus, a conversion of the polycrystalline microstructure to a second microstructure comprising larger grains (e.g., columnar or bamboo microstructure). A laser process can heat the metallic material 150 to a relatively high temperature (e.g., in a range of 200-1000 degrees Celsius) in a short time frame (e.g., 10 nanoseconds to about 5 minutes). In this regard, the use of a laser process to heat treat the metallic material 150 provides precise temperature control of the metallic material 150, while reducing potential thermal damage to surrounding features/components of the semiconductor structure when laser processing the metallic material 150.

A next phase of the fabrication process comprises removing the overburden metallic material 150-3 and the overburden material of the liner layer 140 from the upper surface of the ILD layer 130 using a process flow as schematically illustrated in FIGS. 6, 7, and 8. In particular, FIG. 6 is a cross-sectional schematic side view of the semiconductor device of FIG. 5 after planarizing the surface of the semiconductor device down to the overburden portion of the liner layer 140 on the surface of the ILD layer 140. In one embodiment, a CMP process is performed to remove the overburden metallic material 150-3 while terminating the CMP process when reaching the upper surface of the overburden portion of the liner layer 140. The process of FIG. 6 results in the formation of a metal interconnect structure 155 comprising the metal via 150-1 and the metal line 150-2.

This is in contrast to conventional BEOL process flows where, as noted above, the CMP process would continue to remove the overburden portion of the liner layer 140 and over polish the surface of the semiconductor structure to remove an upper portion of the ILD layer 130 and an upper portion of the metal interconnect structure 155 to ensure that the overburden portion of the liner layer 140 is removed. With the conventional process, a portion of the low-resistivity metallic material (large grain metallic material) in the upper region of the metal line 150-2 of the metal interconnect structure 155 would be removed, while leaving the polycrystalline metallic material in the bottom region of the metal line 150-2, thereby resulting in the formation of a metal line with higher resistance (e.g., smaller cross-sectional area with a higher ratio of polycrystalline metallic material to the large grain metallic material).

In accordance with embodiments of the invention, the overburden portion of the liner layer 140 is selectively removed using a wet chemical etching process. In particular, as an initial step in this process, a controlled surface treatment is applied to convert the metallic material of the overburden portion of the liner layer 140 into a metal nitride material. For example, FIG. 7 is a cross-sectional schematic side view of the semiconductor device of FIG. 6, which shows a controlled surface treatment 200 being applied to the overburden material of the liner layer 140 in the field region to convert the overburden portion of the liner layer 140 into a layer of metal nitride material 142. The controlled surface treatment 200 comprise a nitridation process which serves to infuse nitrogen (N) atoms into the overburden metallic material of the liner layer 140 to form a metal nitride material. For example, when the liner layer 140 is formed of Ti, the overburden portion of the liner layer 140 is converted into a layer of TiN. Similarly, when the liner layer 140 is formed of, e.g., Ta or W, the overburden portion of the liner layer 140 is converted into TaN or WN, respectively.

The controlled surface treatment 200 of FIG. 7 can be implemented using various plasma nitridation methods. In general, for a plasma treatment process, a plasma can be generated using a precursor gas which comprises nitrogen (e.g., $N_2$, $NH_3$, $N_2H_2$, or mixtures thereof, etc.) in an inert atmosphere of He or Ar. In addition, in one embodiment, the plasma treatment is performed in a suitable chamber at a temperature in a range of about 80 degrees Celsius to about 900 degrees Celsius, with a plasma energy that is suitable to perform the surface treatment to a target depth.

In other embodiments, the controlled surface treatment 200 can be implemented using a gas cluster ion beam (GCIB) process, or a neutral atom beam (NAB) technique. In general, these surface treatment techniques involve a bombardment process in which the overburden portion of the liner layer 140 is bombarded with high energy particles to convert the metallic material of the overburden portion of the liner layer 140 into a metal nitride material. The GCIB and NAB treatment methods are technologies that enable nano-scale modification of surfaces, e.g., chemically alter surfaces through infusion. In particular, with GCIB, the overburden portion of the liner layer 140 is bombarded by a beam of high energy nanoscale cluster ions, which are formed when a high pressure gas (e.g., 10 atmospheres pressure) expands into a vacuum. In one example embodiment, a GCIB treatment can be implemented with a suitable mixture of gases (as noted above), in temperature range of about 80 degrees Celsius to about 900 degrees Celsius, and an energy in a range of about 10 keV to about 30 keV to chemically infuse nitrogen atoms into the metallic material of the overburden portion of the liner layer 140 at a controlled penetration depth of less than about 10 nm, and thereby form the metal nitride layer 142 as shown in FIG. 7.

Similarly, a NAB surface treatment enables ultra-shallow processing of surfaces by converting energized gas cluster ions produced by a GCIB method into intense collimated beams of coincident neutral gas atoms having controllable average energies from about 10 eV per atom to about 100 eV per atom. An electrostatic deflector is used to eliminate charged species in the environment, while allowing the released neutral atoms to bombard the surface of the overburden portion of the liner layer 140 and produce effects similar to those normally associated with GCIB, but to shallower controlled penetration depths (e.g., about 3 nm or less). The type of plasma process utilized will depend, for example, on the thickness of the overburden portion of the liner layer 140 so that sufficient penetration depths are achieved to convert the entire thickness of the overburden portion of the liner layer 140 to a metal nitride material.

Following completion of the controlled surface treatment 200, the metal nitride layer 142 disposed on the surface of the ILD layer 140 is selectively removed using a wet etch process. In particular, FIG. 8 is a cross-sectional schematic side view of the semiconductor device of FIG. 7 after selectively removing the layer of metal nitride material 142 from the surface of the ILD layer without removing any dielectric material of the ILD layer 130 or any metallic material of the metal line 150-2. In one embodiment, the layer of metal nitride material 142 (e.g., TiN) is removed selective to the metallic material of the liner layer 140 (e.g., Ti) using a wet etch process with an etch chemistry comprising a mixture of hydrogen peroxide ($H_2O_2$) and an acid. For example, the acid may comprise at least one of hydrofluoric acid (HF), hydrochloric acid (HCl), sulfuric acid ($H_2SO_4$), peroxynitric acid ($HNO_4$), or other suitable acids, etc.

The selective removal of the layer of metal nitride material 142 as discussed above effectively serves to remove the overburden portion of the liner layer 140 by using a CMP-free process, and thereby avoid removal of the upper portions of the ILD layer 130 and the metal line 150-2 as in conventional methods in which CMP is used to over polish the surface of the semiconductor structure to ensure removal of the overburden metallic material of the liner layer 140. Indeed, as shown in FIG. 8, after the layer of metal nitride material 142 is etched away, an upper surface of the liner layer 140 will be substantially coplanar with a surface of the dielectric layer 130, and the upper surface of the metal line 150-2 of the metal interconnect structure 155 will be slightly extended above the surface of the ILD layer 130 at a height H. In one embodiment, the height H is in a range of about 0.5 nm to about 10 nm. This is in contrast to conventional methods in which CMP is utilized to remove the overburden materials of the liner layer 140 and metallic layer 150 and over polish the ILD layer 130, wherein the upper surface of the metal line 150-2 would be either level with the planarized surface of the ILD layer 130 or recessed/dished below the surface of the ILD layer 130.

Following removal of the layer of metal nitride material 142, a capping layer is formed over the semiconductor structure shown in FIG. 8. In particular, FIG. 9 is a cross-sectional schematic side view of the semiconductor device of FIG. 8 after forming a capping layer 160 over the surface of the ILD layer 130 and the exposed surface of the metal interconnect structure 155. The capping layer 160 is formed of a dielectric material which is non-reactive with the metallic material that is used to form the metal interconnect structure 155 and other metal interconnect structures that are formed in ILD layer 130 of the first interconnect level of the BEOL layer. The capping 160 layer serves to insulate exposed surface portions of the metallization structures formed in the ILD layer 130 from the dielectric material of another ILD layer (second interconnect level) formed on top of the ILD layer 130. For example, in a BEOL structure using copper metallization, the dielectric capping layer 160 serves to improve interconnect reliability by preventing oxidation of the copper metallization and preventing copper material of the metallization structures from diffusing into the dielectric material of the ILD layer.

The dielectric capping layer 160 could be formed of silicon nitride (SiN), silicon carbide (SiC), silicon carbon nitride (SiCN), hydrogenated silicon carbide (SiCH), or a multilayer stack comprising the same or different types of dielectric materials, etc., and deposited using standard deposition techniques, for example, chemical vapor deposition. The capping layer 160 can be formed with a thickness in a range from about 2 nm to about 60 nm. On the other hand, if the metallic material used to form the metallization structures in the ILD layer 130 comprises tungsten, for example, another ILD layer could be deposited directly on the ILD layer 130 (without having to form the capping layer 160) as tungsten is not reactive with typical dielectric materials that are used to form ILD layers.

The process flow of FIGS. 1 through 9 can be repeated to form one or more additional interconnect levels above the ILD layer 130 shown in FIG. 9 to construct a BEOL layer. The process flows described herein for fabricating metal interconnect structures allow for the fabrication of metal lines with large grain structures with reduced resistivity, while eliminating the need for over polishing the ILD layers and metallization structures at each interconnect level to remove overburden liner material from the field regions during BEOL fabrication. The CMP-free removal of the overburden metallic material of the liner layers protects the ILD layers from dielectric damage due to CMP, as well as prevents dishing/recess of the upper surface of the metallization structures due to CMP, as in conventional methods discussed above.

It is to be understood that the methods discussed herein for fabricating metallic interconnect structures (e.g., copper BEOL interconnect structures) can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

I claim:

1. A semiconductor device, comprising:
   a metal interconnect structure disposed within a dielectric layer, wherein the metal interconnect structure comprises a metal line, and a non-nitride metallic liner disposed between the metal line and the dielectric layer;
   wherein an upper surface of the non-nitride metallic liner is coplanar with a surface of the dielectric layer;
   wherein an upper surface of the metal line extends above the surface of the dielectric layer by an amount of about 0.5 nm to about 10 nm;
   wherein at least an upper portion of the metal line comprises grains that have an average grain size which is greater than a critical dimension of the metal line;
   wherein the grains in the upper portion of the metal line have an average grain size which is greater than an average grain size of grains in a lower portion of the metal line.

2. The semiconductor device of claim 1, wherein the metal line comprises copper.

3. The semiconductor device of claim 1, wherein the non-nitride metallic liner comprises at least one of tantalum, tungsten, aluminum, cobalt, ruthenium, iridium, rhodium, manganese, and nickel.

4. The semiconductor device of claim 1, further comprising a capping layer disposed over the dielectric layer.

5. The semiconductor device of claim 1, wherein the layer of dielectric material comprises an interlayer dielectric (ILD) layer of a back-end-of-line (BEOL) structure.

6. The semiconductor device of claim 1, wherein the metal interconnect structure is disposed on a substrate.

7. The semiconductor device of claim 6, wherein the substrate comprises a base semiconductor substrate and a front end of the line and middle of the line structure formed on a front side surface of the substrate.

8. The semiconductor device of claim 6, wherein the substrate comprises a bulk semiconductor substrate.

9. The semiconductor device of claim 6, further comprising a capping layer disposed over the dielectric layer.

10. The semiconductor device of claim 9, wherein the capping layer has a thickness in a range from about 2 nm to about 60 nm.

11. An integrated circuit comprising:
    one or more semiconductor devices, wherein at least one of the semiconductor comprises:
    a metal interconnect structure disposed within a dielectric layer, wherein the metal interconnect structure comprises a metal line, and a non-nitride metallic liner disposed between the metal line and the dielectric layer;
    wherein an upper surface of the non-nitride metallic liner is coplanar with a surface of the dielectric layer;
    wherein an upper surface of the metal line extends above the surface of the dielectric layer by an amount of about 0.5 nm to about 10 nm;
    wherein at least an upper portion of the metal line comprises grains that have an average grain size which is greater than a critical dimension of the metal line;
    wherein the grains in the upper portion of the metal line have an average grain size which is greater than an average grain size of grains in a lower portion of the metal line.

12. The integrated circuit of claim 11, wherein the metal line comprises copper.

13. The integrated circuit of claim 11, wherein the non-nitride metallic liner comprises at least one of tantalum, tungsten, aluminum, cobalt, ruthenium, iridium, rhodium, manganese, and nickel.

14. The integrated circuit of claim 11, further comprising a capping layer disposed over the dielectric layer.

15. The integrated circuit of claim 11, wherein the layer of dielectric material comprises an interlayer dielectric (ILD) layer of a back-end-of-line (BEOL) structure.

16. The integrated circuit of claim 11, wherein the metal interconnect structure is disposed on a substrate.

17. The integrated circuit of claim 16, wherein the substrate comprises a base semiconductor substrate and a front end of the line and middle of the line structure formed on a front side surface of the substrate.

18. The integrated circuit of claim 16, wherein the substrate comprises a bulk semiconductor substrate.

19. The integrated circuit of claim 16, further comprising a capping layer disposed over the dielectric layer.

20. The integrated circuit of claim 19, wherein the capping layer has a thickness in a range from about 2 nm to about 60 nm.

* * * * *